US005801574A

United States Patent [19]
Martin et al.

[11] Patent Number: 5,801,574
[45] Date of Patent: Sep. 1, 1998

[54] CHARGE SHARING DETECTION CIRCUIT FOR ANTI-FUSES

[75] Inventors: Chris G. Martin; Stephen L. Casper, both of Boise, Id.

[73] Assignee: Micron Technology, Inc., Boise, Id.

[21] Appl. No.: 727,797

[22] Filed: Oct. 7, 1996

[51] Int. Cl.$^6$ .................................................. G11C 17/16
[52] U.S. Cl. ........................ 327/525; 365/96; 365/225.7
[58] Field of Search ................ 327/525, 77; 365/225.7, 365/96, 189.05, 200, 201; 326/38, 39, 41

[56] References Cited

U.S. PATENT DOCUMENTS

| | | | |
|---|---|---|---|
| 4,567,387 | 1/1986 | Wacyk | 307/530 |
| 4,962,326 | 10/1990 | Parkinson et al. | 307/443 |
| 5,132,575 | 7/1992 | Chern | 307/530 |
| 5,148,391 | 9/1992 | Zagar | 365/96 |
| 5,175,450 | 12/1992 | Chern | 307/530 |
| 5,315,177 | 5/1994 | Zagar et al. | 307/465 |
| 5,345,110 | 9/1994 | Renfro | 307/272.3 |
| 5,400,283 | 3/1995 | Raad | 365/203 |
| 5,424,672 | 6/1995 | Cowles et al. | 327/525 |
| 5,627,478 | 5/1997 | Habersetzer et al. | 324/763 |
| 5,631,862 | 5/1997 | Cutter et al. | 365/96 |
| 5,657,293 | 8/1997 | Merritt et al. | 365/233.5 |

FOREIGN PATENT DOCUMENTS 0661709  7/1995  European Pat. Off. .......... G11C 7/06

OTHER PUBLICATIONS

"Low Power Scheme for Fuse Latches", *IBM Technical Disclosure Bulletin*, vol. 38, No. 7, pp. 509–510, (Jul. 1995).

*Primary Examiner*—Timothy P. Callahan
*Assistant Examiner*—Eunja Shin
*Attorney, Agent, or Firm*—Schwegman, Lundberg, Woessner & Kluth, P.A.

[57] ABSTRACT

A detection circuit for detecting unblown and blown conditions for an anti-fuse. The detection circuit includes a precharge circuit for applying a precharge to the anti-fuse during a precharge time interval, and a sampling circuit for coupling the anti-fuse to the detection node to provide a voltage at the detection node that is indicative of the ability of the anti-fuse to retain a charge during the discharge time interval. An output circuit that is coupled to the detection node is responsive to the voltage provided at the detection node to provide a first output for indicating an unblown condition for the anti-fuse and a second output for indicating a blown condition for the anti-fuse.

17 Claims, 1 Drawing Sheet

CHARGE SHARING DETECTION CIRCUIT FOR ANTI-FUSES

FIELD OF THE INVENTION

The present invention relates to programmable logic devices, and more particularly, to a detection circuit and method for detecting the state of a programmable logic device, such as an anti-fuse.

BACKGROUND OF THE INVENTION

Programmable logic devices are commonly used for changing the connectivity of a circuit after it has been fabricated. One application of programmable logic devices is in the repair of integrated circuit memories. Integrated circuit memories are often fabricated with several redundant elements (rows or columns) of memory cells. Each redundant row has an associated comparison module which is formed by an array of programmable logic devices and which is capable of receiving a multi-bit address. The programmable logic devices of the array are selectively programmed to respond to a specific address as necessary to reroute memory addresses for replacing a redundant row for a failed memory row.

One type of programmable logic device that is commonly used for these applications is the anti-fuse. In its unblown condition, the anti-fuse functions as a capacitor and presents a very high resistance on the order of 10 Megohms. To program an anti-fuse, its connections are shorted together providing a relatively low resistance path through the anti-fuse, typically presenting a resistance of about 200 to 500 ohms.

Typically, a detection circuit is used to determine the condition of an anti-fuse. The detection circuit includes a pull-up transistor that is connected in series with the anti-fuse between the Vcc rail and the ground rail of the detection circuit. A voltage level detecting circuit connects the ungrounded terminal of the anti-fuse at a detection node to the output of the detection circuit. For an unblown condition for the anti-fuse, a voltage at approximately Vcc is provided at the detection node. For a blown condition for the anti-fuse, the shorted anti-fuse connects ground to the input of the level detecting circuit. A latch arrangement, triggered by the voltage level detecting circuit, is provided to isolate the detection node and the blown anti-fuse from the Vcc rail for the blown condition for the anti-fuse.

In programming an anti-fuse, the anti-fuse may not blow clean. In such case, the anti-fuse presents a relatively high resistance which can be on the order of 400K ohms. Accordingly, a partially blown anti-fuse forms a voltage divider in combination with the pull-up transistor so that rather than being at ground, the voltage provided at the detection node will trip the level detecting circuit, so that the detection circuit will produce an erroneous output.

For the reasons stated above, and for other reasons stated below which will become apparent to those skilled in the art upon reading and understanding the present specification, there is a need in the art for a method of and a detection circuit for detecting the state of a programmable logic device, such as an anti-fuse or the like, which can tolerate highly resistive blows and which can quickly set the programmable logic device to the correct state whenever necessary.

SUMMARY OF THE INVENTION

The present invention provides a detection circuit for detecting the condition of a programmable logic device, such as an anti-fuse. In accordance with the invention, the detection circuit includes a precharge circuit for applying a precharge to the anti-fuse during a precharge time interval and a coupling circuit for coupling the anti-fuse to a detection node to provide a voltage at the detection node is indicative of the ability of the anti-fuse to retain a charge. If the anti-fuse is unblown, the anti-fuse retains the charge so that when the anti-fuse is coupled to the detection node, the voltage at the detection node is above the turnon threshold for an output circuit. However, if the anti-fuse is blown, the precharge will leak off, so that the voltage at the detection node will be below the turnon threshold for the output circuit.

Further in accordance with the invention, there is provided a method for detecting unblown and blown conditions for an anti-fuse. The method includes precharging the anti-fuse during a time interval and coupling the anti-fuse to said detection node to provide a voltage at the detection node that is dependent upon the ability of the anti-fuse to retain a charge, and is thus indicative of whether the anti-fuse is in an unblown or a blown condition.

Thus, according to the invention, detecting the condition of an anti-fuse is based upon the ability of the anti-fuse to retain a charge, rather than on a change in resistance of the anti-fuse. Consequently, the invention minimizes the restrictive nature of voltage divider circuits as may result from a highly resistive blow condition for an anti-fuse.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only by the appended claims.

The present invention provides a detection circuit for detecting the condition of a programmable logic device. In an exemplary embodiment, the detection circuit is used to detect the condition of an anti-fuse 10 that is employed in a semiconductor memory device, such as in a match fuse bank circuit which is used to reroute memory addresses for replacing a redundant memory row or column portion for a failed memory row or column portion. However, the detection circuit can be used anywhere an anti-fuse 10 is used.

In the unblown state, the anti-fuse 10 functions as a capacitor and presents a high impedance, typically on the order of about 10 Megohms, for example. In the blown state, the anti-fuse 10 is changed permanently to a low-resistance structure, presenting a resistance of about 200 to 500 ohms, for example, if a clean blow is produced during programming. However, if the anti-fuse 10 is only partially blown, the anti-fuse 10 can present a very high resistance on the order of about 400K ohms, for example.

Figure 1:
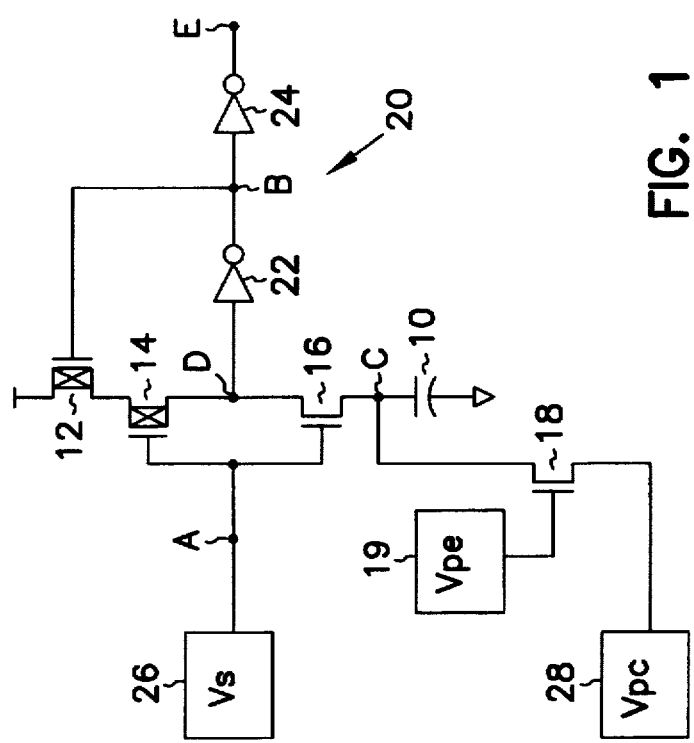
FIG. 1 is a schematic circuit diagram of an anti-fuse detection circuit for detecting the condition of an anti-fuse.

Referring to FIG. 1, the detection circuit includes an input node A, an intermediate node B, a precharge node C, a detection node D and an output node E. The detection node D is connected to a first voltage supply, such as the supply rail for voltage Vcc, through series connected p-channel transistors 12 and 14. Transistor 12, which forms a half-latch circuit, has a source connected to the Vcc supply rail and a drain connected to the source of transistor 14. Transistor 14, which functions as a pull-up transistor, has a gate connected to input node A and a drain connected to detection node D. In the exemplary embodiment, the supply voltage Vcc is 3 volts, which represents a logic high level for the detection circuit. Ground represents a logic low level for the detection circuit and is the true or active state for the detection circuit.

The detection node D also is connected to a second voltage supply, which can be ground, through an n-channel transistor 16 and the anti-fuse 10. Transistor 16 has a drain connected to detection node D, a gate connected to input node A and a source connected to precharge node C. In addition, the detection node D is coupled to the output node E through an output circuit 20 that includes series connected inverters 22 and 24. The inverter 22 has an input connected to the detection node D and an output connected to the intermediate node B. Inverter 24 has an input connected to node B and an output connected to the output node E. The intermediate node B is also connected to the gate of transistor 12 to provide a feedback disable signal to transistor 14 for isolating the detection node from the Vcc supply rail for a blown condition for the anti-fuse 10.

In accordance with the invention, detection of the condition of the anti-fuse is based upon the ability of the anti-fuse to retain a charge, rather than on a change in resistance of the anti-fuse. In the exemplary embodiment, a precharge voltage is applied to the anti-fuse for charging the anti-fuse during a precharge time interval. Then, a discharge time interval is initiated. If the anti-fuse is in an unblown condition, the anti-fuse retains the precharge during the discharge time interval. However, if the anti-fuse is in a blown condition, the precharge leaks off to ground during the discharge time interval. Thus, at the end of the discharge time interval, the magnitude of the voltage at node C is indicative of the ability of the anti-fuse to retain a charge during the discharge time interval, and thus indicates if the anti-fuse is in an unblown or blown condition. The duration of the discharge time interval is not critical, but is long enough to allow the precharge to leak off the anti-fuse when the anti-fuse is in a blown condition. Also, when the detection circuit is used in semiconductor memory applications, the durations of the precharge interval, the discharge interval and sampling interval preferably are selected so that the precharging, sampling and reading of an anti-fuse can be carried out within one RAS cycle for the semiconductor memory.

More specifically, the precharge node C, at the junction of the anti-fuse 10 and the source of transistor 16, is connected through a pass transistor 18 to a source 28 of a precharge voltage Vpc. The pass transistor 18 is an n-channel transistor, the gate of which is connected to a source 19 of a precharge enable signal Vpe for biasing the transistor 18 to a conducting condition during a precharge time interval that is defined by the duration of the precharge enable signal. Transistor 18, the precharge enabling signal source 19 and the precharge voltage source 28 comprise a precharge circuit portion of the detection circuit. In the exemplary embodiment wherein the supply voltage Vcc is 3 volts, the precharge voltage Vpc is 1.3 volts, but the precharge voltage can be higher and lower depending upon the supply voltage that is used. For example, the precharge voltage can be about 40% to 60% of the supply voltage Vcc. The precharge voltage Vpc establishes a voltage level or precharge on the anti-fuse 10 that both compensates for the high resistance effect if the anti-fuse 10 is only partially blown and also allows for fast correction if the anti-fuse 10 is set to the wrong state following power-up.

For the purpose of determining if the anti-fuse has retained the precharge, the voltage on the anti-fuse is sampled at the end of the discharge interval. To this end, the gates of transistors 14 and 16 are commonly connected to the input node A which, in turn, is connected to a source 26 of a sample enable signal Vs. The sample enable signal Vs swings between Vcc and about 1.5 volts and can be approximately 32 nano-seconds in duration, for example. For an unblown condition for the anti-fuse, the precharge voltage Vpc applied to the precharge node C prior to the sampling interval causes the voltage at node D to be maintained above the turnon threshold for the level detector 22 when the anti-fuse is sampled. For a blown condition for the anti-fuse, the precharge voltage applied to the precharge node C will leak off to ground, allowing the voltage at node D to decrease to a level that is below the turnon threshold for the level detector 22 when the anti-fuse 10 is sampled.

Following the sampling interval defined by the sample enable signal, and for an unblown condition for the anti-fuse 10, a voltage approximately at level Vcc is provided at the detection node D which causes the signal output of the detection circuit, at node E, to be at logic high level. For a blown condition for the anti-fuse 10, the signal level at the detection node D is near ground, causing the signal output of the detection circuit, at node E, to be at a logic low level, which is the active state for the detection circuit.

Figure 2:
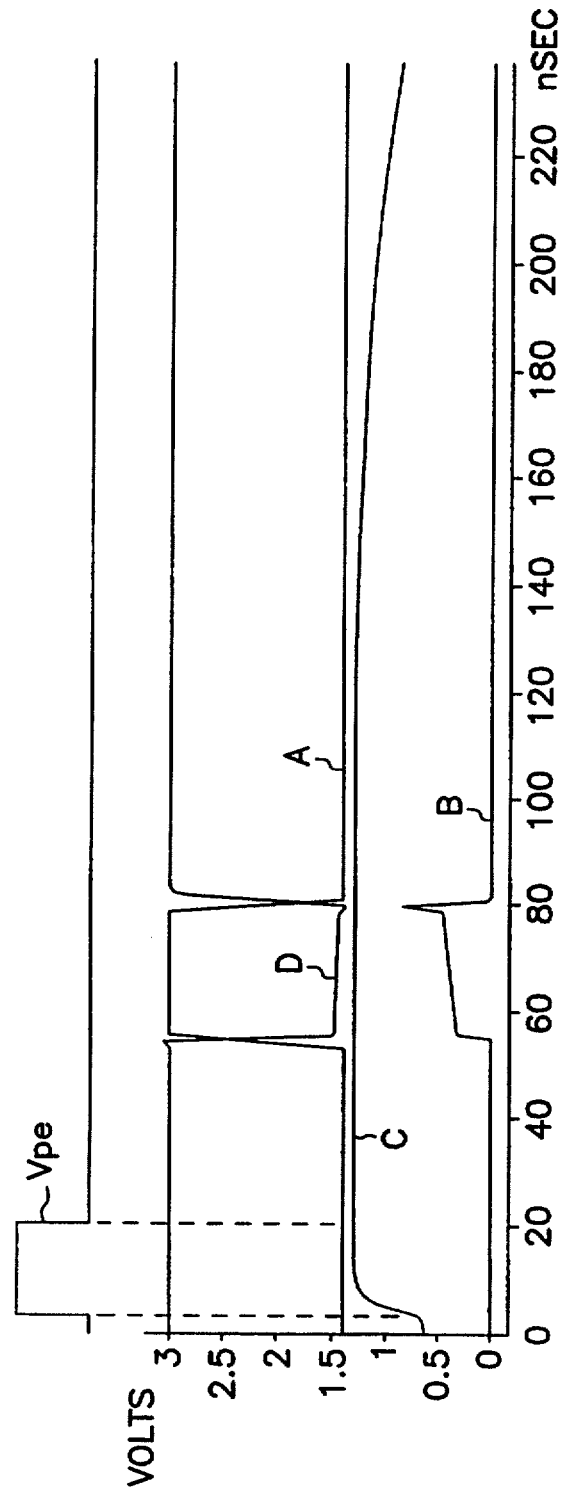
FIG. 2 is a timing chart showing signals provided by the anti-fuse detection circuit in detecting the condition of an unblown anti-fuse that is in the proper state.

FIG. 2 is a timing chart showing signals provided during the detection of the state of the anti-fuse 10 of FIG. 1 for the conditions that the anti-fuse 10 is in an unblown condition and is in the proper state. The voltage levels labeled A–D in FIG. 2 correspond to the voltages at nodes A–D. Also, the precharge time interval is represented by the precharge enable signal Vpe that is shown above the waveforms A–D.

Considering the operation of the detection circuit in more detail, with reference to FIGS. 1 and 2, for an unblown condition for the anti-fuse 10, transistors 12 and 14 are conducting so that Vcc is extended to node D. Because the voltage at detection node D is at logic high level, the voltage at intermediate node B is at logic low level and the output of the detection circuit, at node E, is at logic high level, which is the inactive state for the detection circuit.

When the precharge enable signal Vpe is provided, the pass transistor 18 is turned on, extending the precharge voltage Vpc to the precharge node C for the precharge time interval defined by the precharge enable signal. Transistor 16, which is non-conducting, isolates the precharge node C, and the anti-fuse 10, from the detection node D. This allows the anti-fuse 10 to be charged to approximately 1.3 volts, which is the level of the precharge voltage Vpc being applied to the precharge node C. The duration of the precharge enable signal is sufficient to allow the anti-fuse to charge to the level of the precharge voltage. When the precharge enable signal terminates, the pass transistor 18 is turned off, disconnecting the precharge signal source from the precharge node C. However, the anti-fuse retains the precharge.

After a discharge time interval, the sample enable signal is provided to sample the voltage on node C, and thus the precharge retained by the anti-fuse. When the sample enable signal Vs is applied to node A, transistor 14 is turned off, isolating node D from the Vcc supply rail. Also, transistor 16 is turned on, coupling node C, and thus the anti-fuse 10, to detection node D. Even though Vcc is disconnected from the detection node, the voltage at node D is maintained above the turnon threshold for inverter 22 of the detecting circuit because the precharge node C is precharged to approximately 1.3 volts. This maintains the voltage at node B below the turnoff threshold for the half latch transistor 12. Consequently, when the sample enable signal terminates and transistor 14 is turned on again, the detection node D is pulled up quickly to Vcc. Simultaneously, transistor 16 is turned off to isolate node C from the detection node D.

Figure 3:
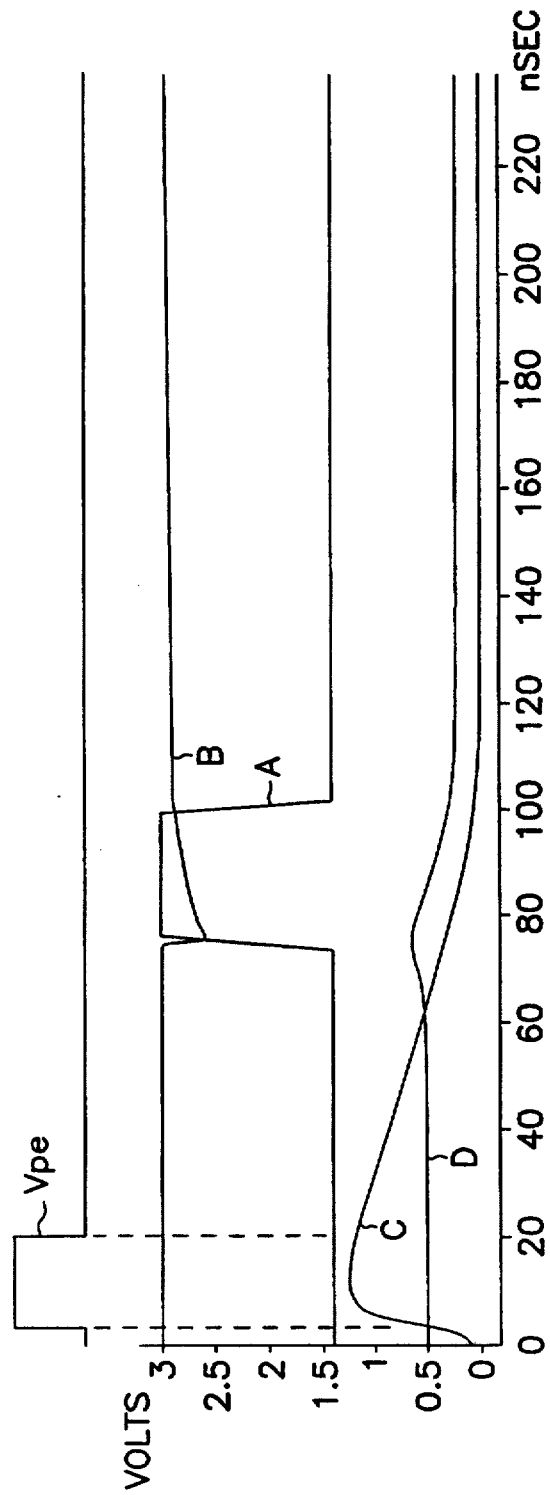
FIG. 3 is a timing chart showing signals provided by the anti-fuse detection circuit in detecting the condition of a blown anti-fuse that is initially in the proper state.

FIG. 3 is a timing chart showing signals provided during the detection of the state of the anti-fuse 10 of FIG. 1 when the anti-fuse 10 is in a blown condition and is initially in the proper state. The voltage levels labeled A–D in FIG. 3 correspond to the voltages at nodes A–D.

Referring to FIGS. 1 and 3, for the condition where the anti-fuse 10 is in a blown condition, then, prior to the sample enable signal Vs, transistor 14 is conducting. However, transistor 12 is held non-conducting by the feedback disable signal provided at node B, which is near logic high level. For such condition, the detection node D is near ground. Also, the output of the detection circuit is at logic low level, which is the active state for the detection circuit.

When the precharge enable signal Vpe is provided, the pass transistor 18 is turned on, extending the precharge voltage Vpc to the precharge node C, providing a voltage at about 1.3 volts at node C. Transistor 16, which is non-conducting, isolates node C, and the anti-fuse 10, from the detection node D.

When the precharge enable signal Vpe terminates, the pass transistor 18 is turned off, disconnecting the precharge signal source 19 from the precharge node C. Because the anti-fuse is blown, the precharge on the anti-fuse will rapidly leak off to ground, causing the voltage at precharge node C to decrease to near ground during the discharge time interval.

When the sample enable signal Vs is provided at the end of the discharge interval, transistor 14 is turned off, isolating node D from the Vcc supply rail. Also, transistor 16 is turned on, coupling node C and the anti-fuse 10 to detection node D. Because node C is near ground, the voltage at detection node D is maintained below the turnon threshold of the inverter 22, preventing the inverter 22 from switching state. Consequently, the voltage at node B is maintained above the turn-off threshold for the half latch transistor 12, so that transistor 12 remains biased off. When the sample enable signal Vs terminates, transistor 16 is turned off. The voltage at detection node D remains below the turnon threshold for the inverter 22 so that the voltage at node B maintains the transistor 12 biased off.

Figure 4:
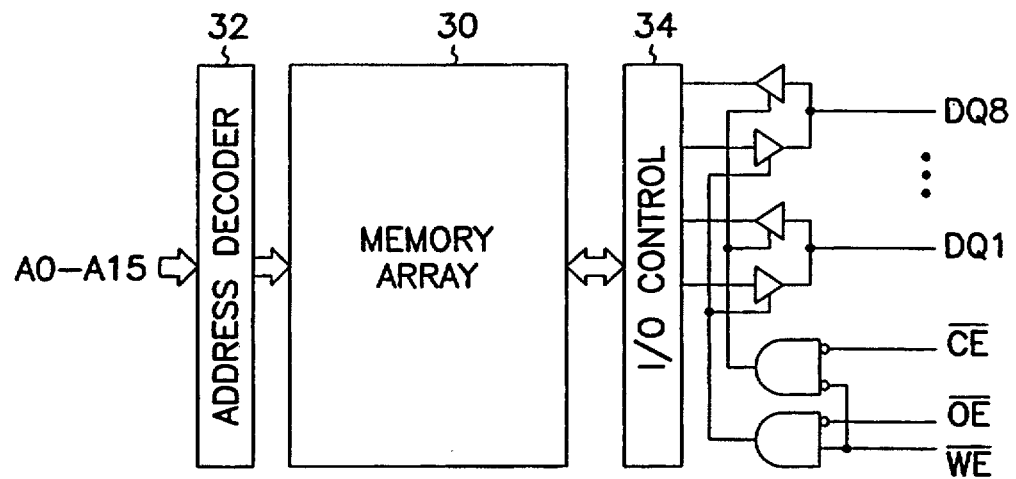
FIG. 4 is a simplified representation of an integrated circuit memory incorporating the anti-fuse detection circuit provided by the invention.

The above described detection circuit and anti-fuse can be fabricated in any integrated circuit, including but not limited to memories such as SRAMs and DRAMs, programmable logic devices, PROMs, EPROMs, and EEPROMs. FIG. 4 is a simplified block diagram of a static random access memory device (SRAM) incorporating the detection circuit of the present invention. The memory device is organized as a 128 k×8 SRAM having eight bit data input/output paths labeled DQ1–DQ8 providing data storage for 1,048,576 bits of information in a memory array 30. An address decoder circuit 32 accesses memory cells in response to signals provided on the address inputs (A0–A15). An input/output control 34 controls path selection in writing of data into the memory and reading of data out of the memory. Data is written to the memory when a write enable signal WE* and a chip enable signal CE* are both low. Data is read from the memory when the write enable signal WE* is high and the chip enable signal CE* and an output enable signal (OE*) are both low.

Figure 5:
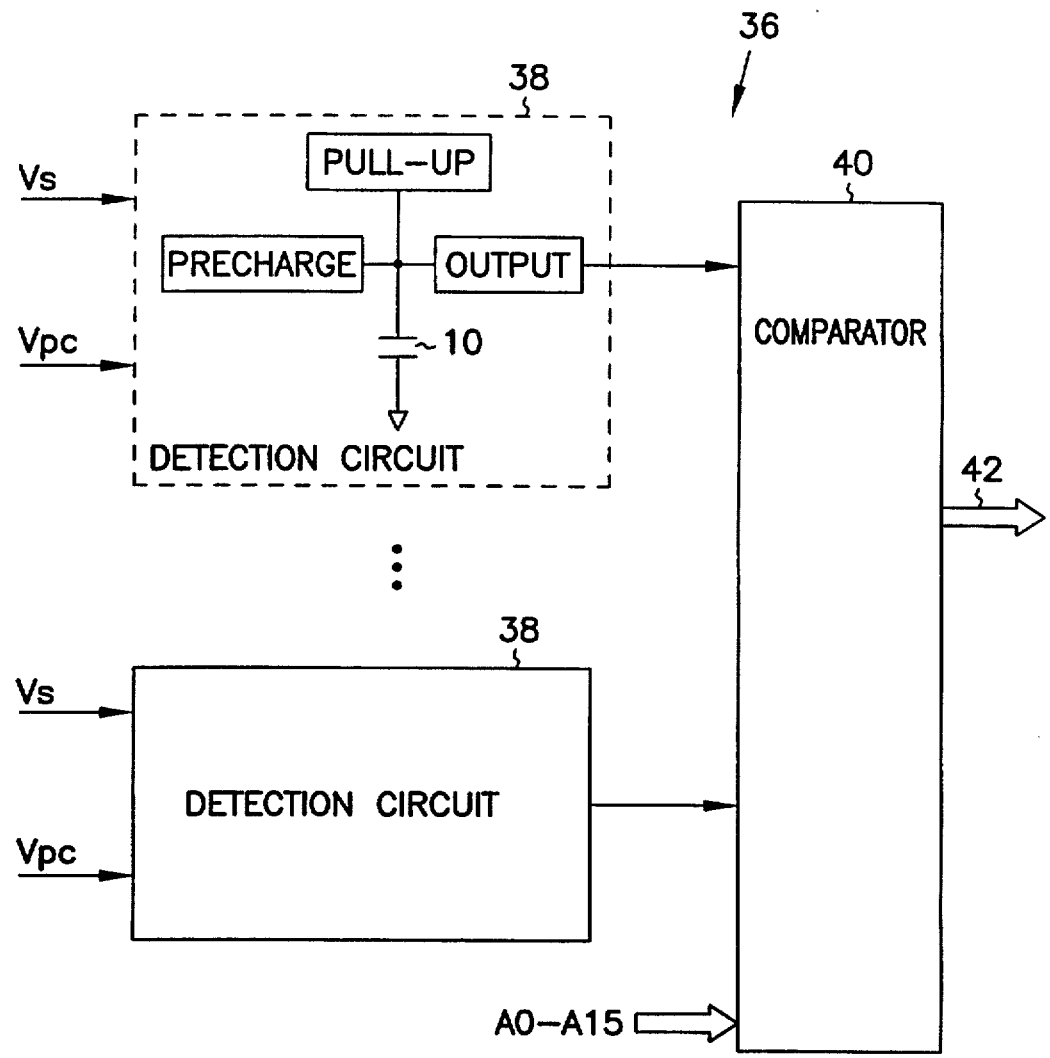
FIG. 5 is a portion of the integrated circuit memory of FIG. 4 showing one of the anti-fuses used in the integrated circuit memory.

FIG. 5 illustrates a portion of the memory device of FIG. 4 which incorporates into the address decoder circuit 32, a programmable circuit or array, indicated generally at 36, which includes a plurality of the detection circuits 38, each detecting unblown and blown conditions for an anti-fuse, such as anti-fuse 10, in the manner described above. Each of the detection circuits 38 receives the sample enable signal Vs and the precharge signal Vpc. A plurality of such anti-fuses can be connected in a match fuse bank used for indicating memory cell addresses of memory cells which have been determined to be defective such that redundant memory cells can be used. A comparator circuit 40 is provided which compares the external memory addresses to a plurality of anti-fuses, such as the anti-fuse 10, and produces an appropriate memory cell output address 42. The output address can then be used to access redundant memory cells when appropriate. The anti-fuse is connected in the detector circuit which receives the signal Vcc and the precharge signal Vpc. It will be appreciated that the anti-fuse 10 can be incorporated into the memory circuit for any desired purpose and is not limited to redundant memory cell circuitry.

Thus, it has been shown that the present invention provides a detection circuit for detecting unblown and blown conditions of an anti-fuse. The invention applies a precharge voltage to the anti-fuse during a precharge time interval prior to detecting the condition of the anti-fuse. The anti-fuse is coupled to the detection node to allow detection of the charge retained by the anti-fuse. In one embodiment, At the end of a discharge time interval following the precharge time interval, a the anti-fuse is coupled to the detection node at the end of a discharge time interval following the end of the precharge time interval. If the anti-fuse is unblown, the anti-fuse remains charged during the discharge time interval and so that when the anti-fuse is coupled to the detection node, the voltage at the detection node will be above the turnon threshold for the output circuit. However, if the anti-fuse is blown, the precharge will be leak prior to detecting the condition of the anti-fuse, so that when the anti-fuse is coupled to the detection node, the voltage at the detection node is below the turnon threshold for the output circuit. Therefore, the magnitude of the voltage that is provided at the detection node is dependent upon the ability of the anti-fuse to retain a charge, and is thus indicative of an unblown or a blown condition for the anti-fuse. Accordingly, the invention minimizes the restrictive nature of voltage divider circuits as may result from a highly resistive blow condition for an anti-fuse.

What is claimed is:

1. A detection circuit for detecting first and second conditions for a programmable logic device, said detection circuit comprising:

a detection node;

a precharge circuit for applying a precharge voltage to the programmable logic device during a precharge time interval; and a circuit for coupling the programmable logic device to said detection node after a predetermined discharge time interval after said precharge time interval to provide a voltage at said detection node that is indicative of the ability of the programmable logic device to retain a charge for the duration of said predetermined discharge time interval.

2. The detection circuit according to claim 1, and further including an output circuit coupled to said detection node, said output circuit being responsive to the voltage existing at said detection node after the end of said predetermined discharge time interval to provide a first output for indicating a first condition for the programmable logic device and a second output for indicating a second condition for the programmable logic device.

3. A detection circuit for detecting the condition of an anti-fuse, said detection circuit comprising:

a detection node;

a precharge circuit for applying a precharge to the anti-fuse during a precharge time interval;

a coupling circuit for coupling the anti-fuse to said detection node after a predetermined discharge interval after said precharge time interval to provide a voltage at said detection node that is indicative of the charge remaining on said anti-fuse after the end of said predetermined discharge interval; and an output circuit coupled to said detection node, said output circuit being responsive to the voltage existing at said detection node to provide a first output for indicating an unblown condition for the anti-fuse and a second output for indicating a blown condition for the anti-fuse.

4. The detection circuit according to claim 3, wherein said coupling circuit includes a switching device for isolating the anti-fuse from said detection node during said precharge time interval.

5. The detection circuit according to claim 4, wherein said switching device comprises a first transistor interposed between said detection node and the anti-fuse, said first transistor having a control input connected to receive an enabling signal for operating said first transistor between a first state in which said first transistor isolates the anti-fuse from said detection node and a second state in which said first transistor couples the anti-fuse to said detection node.

6. The detection circuit according to claim 5, and further including a second transistor interposed between said detection node and a first voltage supply, said second transistor having an input connected to receive an enabling signal for operating said second transistor between a first state in which said second transistor permits said detection node to be coupled to said first voltage supply, and a second state in which said second transistor prevents said detection node from being coupled to said first voltage supply.

7. A detection circuit for detecting unblown and blown conditions for an anti-fuse, said detection circuit comprising:

a detection node;

a first switching device for coupling said detection node to a first voltage supply;

a second switching device interposed between the anti-fuse and said detection node; and a precharge circuit for applying a precharge voltage to the anti-fuse for charging the anti-fuse during a precharge time interval;

said first switching device being responsive to an enabling signal to isolate said detection node from the first voltage supply, said second switching device being responsive to said enabling signal to couple the anti-fuse to said detection node at the end of a discharge time interval initiated at the end of the precharge time interval, and while said detection node is isolated from the first voltage supply by said first switching device, for providing at said detection node a voltage the magnitude of which is dependent upon the charge remaining on said anti-fuse after the end of said discharge time interval, and is thus indicative of the condition of the anti-fuse.

8. The detection circuit according to claim 7, and further comprising an output circuit coupled to said detection node, said output circuit being responsive to the voltage existing at said detection node after the end of said discharge time interval for providing a first output for indicating an unblown condition for the anti-fuse and a second output for indicating a blown condition for the anti-fuse.

9. The detection circuit according to claim 8, and further including a third switching device which is connected in series with said first switching device between said detection node and said first voltage supply, said third switching device having a control input connected to said output circuit for receiving a feedback disable signal, said feedback disable signal causing said third switching device to isolate said detection node from said first voltage supply for one of the conditions of the anti-fuse.

10. The detection circuit according to claim 9, wherein said first switching device comprises a first p-channel transistor having a gate coupled to an input node of the detection circuit for receiving said enabling signal, wherein said third switching device comprises a second p-channel transistor having a gate coupled to said output circuit for receiving said feedback disable signal, and wherein said second switching device is an n-channel transistor having a gate coupled to said input node for receiving said enabling signal.

11. The detection circuit according to claim 9, wherein said output circuit comprises a first inverter circuit having an input connected to said detection node and an output connected to an intermediate node, and a second inverter circuit having an input connected to said intermediate node and an output connected to an output node.

12. A semiconductor memory device, comprising:

a memory array having a plurality of addressable memory cells;

an address decoder circuit responsive to address signals for accessing memory cells;

a programmable array associated with said address decoder circuit, said programmable array including at least one anti-fuse and at least one detection circuit for detecting first and second conditions for an anti-fuse, said detection circuit comprising:

a detection node;

a precharge circuit for applying a precharge to the anti-fuse during a precharge time interval;

a coupling circuit for coupling the anti-fuse to said detection node after a predetermined discharge time interval after said precharge time interval to provide a voltage at said detection node that is indicative of the ability of the anti-fuse to retain a charge for the duration of said predetermined discharge time interval; and an output circuit coupled to said detection node, said output circuit being responsive to the voltage existing at said detection node after the end of said predetermined discharge time interval to provide a first output for indicating an unblown condition for the anti-fuse and a second output for indicating a blown condition for the anti-fuse.

13. The semiconductor memory device according to claim 12, wherein said coupling circuit includes a switching device for isolating the anti-fuse from said detection node during the precharge time interval.

14. A method for detecting unblown and blown conditions for an anti-fuse, comprising:

precharging the anti-fuse during a precharge time interval; and coupling the anti-fuse to a detection node after a predetermined discharge time interval following the precharge time interval to provide a voltage at said detection node that is dependent upon the charge remaining on the anti-fuse after the end of the predetermined discharge time interval, and is thus indicative of the condition of the anti-fuse.

15. The method according to claim 14, and including isolating the anti-fuse from said detection node during the precharge time interval.

16. A method for detecting unblown and blown conditions for an anti-fuse, comprising:

coupling a detection node to a first voltage supply;

coupling said detection node to a second voltage supply through the anti-fuse;

isolating the anti-fuse from said detection node during a precharge time interval;

precharging the anti-fuse during the precharge time interval;

isolating said detection node from the first voltage supply; and coupling the anti-fuse to said detection node after a predetermined discharge time interval following the precharge time interval to provide a voltage at said detection node, the magnitude of which is dependent upon the charge remaining on the anti-fuse after the end of the predetermined discharge time interval, and is thus indicative of an unblown or a blown condition for the anti-fuse.

17. The method according to claim 16, wherein precharging the anti-fuse includes applying a precharge voltage to the anti-fuse for charging the anti-fuse; and terminating the application of the precharge voltage to the anti-fuse prior to coupling the anti-fuse to said detection node.

* * * * *

UNITED STATES PATENT AND TRADEMARK OFFICE
CERTIFICATE OF CORRECTION

PATENT NO. : 5,801,574
DATED : September 1, 1998
INVENTOR(S) : Martin et al

Page 1 of 5

It is certified that error appears in the above-identified patent and that said Letters Patent is hereby corrected as shown below:

The drawing sheets consisting of figs. 2 - 5 should be added as shown on the attached sheets.

Signed and Sealed this

Twenty-first Day of March, 2000

Attest:

Q. TODD DICKINSON

Attesting Officer

Commissioner of Patents and Trademarks